US008958240B2

(12) United States Patent
Dieny et al.

(10) Patent No.: US 8,958,240 B2
(45) Date of Patent: Feb. 17, 2015

(54) MAGNETIC DEVICE WITH THERMALLY-ASSISTED SWITCHING

(71) Applicant: Commissariat a l'energie atomique et aux energies alternatives, Paris (FR)

(72) Inventors: Bernard Dieny, Lans en Vercors (FR); Ricardo Sousa, Grenoble (FR)

(73) Assignee: Commissariat À l'Énergie Atomique et aux Énergies Alternatives, Paris (FR)

( * ) Notice: Subject to any disclaimer, the term of this patent is extended or adjusted under 35 U.S.C. 154(b) by 5 days.

(21) Appl. No.: 13/939,441

(22) Filed: Jul. 11, 2013

(65) Prior Publication Data

US 2014/0016405 A1  Jan. 16, 2014

(30) Foreign Application Priority Data

Jul. 11, 2012 (FR) ..................... 12 56670

(51) Int. Cl.
*G11C 11/16* (2006.01)
(52) U.S. Cl.
CPC .......... *G11C 11/161* (2013.01); *G11C 11/1675* (2013.01)
USPC ....................................... 365/158
(58) Field of Classification Search
CPC .................................. G11C 11/1675
USPC .......................... 365/158, 171, 173
See application file for complete search history.

(56) References Cited

U.S. PATENT DOCUMENTS 6,603,677 B2 *  8/2003  Redon et al. ............... 365/158
7,898,833 B2 *  3/2011  Prejbeanu et al. .......... 365/50
7,903,452 B2 *  3/2011  Dittrich et al. ............. 365/158
8,717,812 B2 *  5/2014  Mackay et al. ............. 365/171
2005/0180202 A1  8/2005  Huai et al.

FOREIGN PATENT DOCUMENTS

| EP | 2 447 948 | 5/2012 |
| FR | 2 817 999 | 6/2002 |
| FR | 2 924 851 | 6/2009 |

OTHER PUBLICATIONS

Preliminary Search Report and Written Opinion as issued for French Patent Appln. No. 1256670, dated May 15, 2013.

* cited by examiner

*Primary Examiner* — Harry W Byrne
*Assistant Examiner* — Lance Reidlinger
(74) *Attorney, Agent, or Firm* — Pillsbury Winthrop Shaw Pittman LLP

(57) ABSTRACT

A magnetic thermally-assisted switching device includes a reference layer, a storage layer magnetised along a variable direction, a spacer that separates the reference layer and the storage layer, and magnetically decouples them, a device for heating the pinning layer so that, during heating, the temperature of the pinning layer exceeds its blocking temperature such that the direction of magnetisation of the storage layer is no longer pinned, a device for applying a writing magnetic torque tending to align the magnetisation of the storage layer along one of two stable magnetisation directions once the blocking temperature is reached. The device also includes a device for applying a magnetic polarisation field at least during the heating phase before the blocking temperature is reached such that the direction of magnetisation of the storage layer is always along the direction of the magnetic polarisation field at the moment that the blocking temperature is reached.

14 Claims, 10 Drawing Sheets

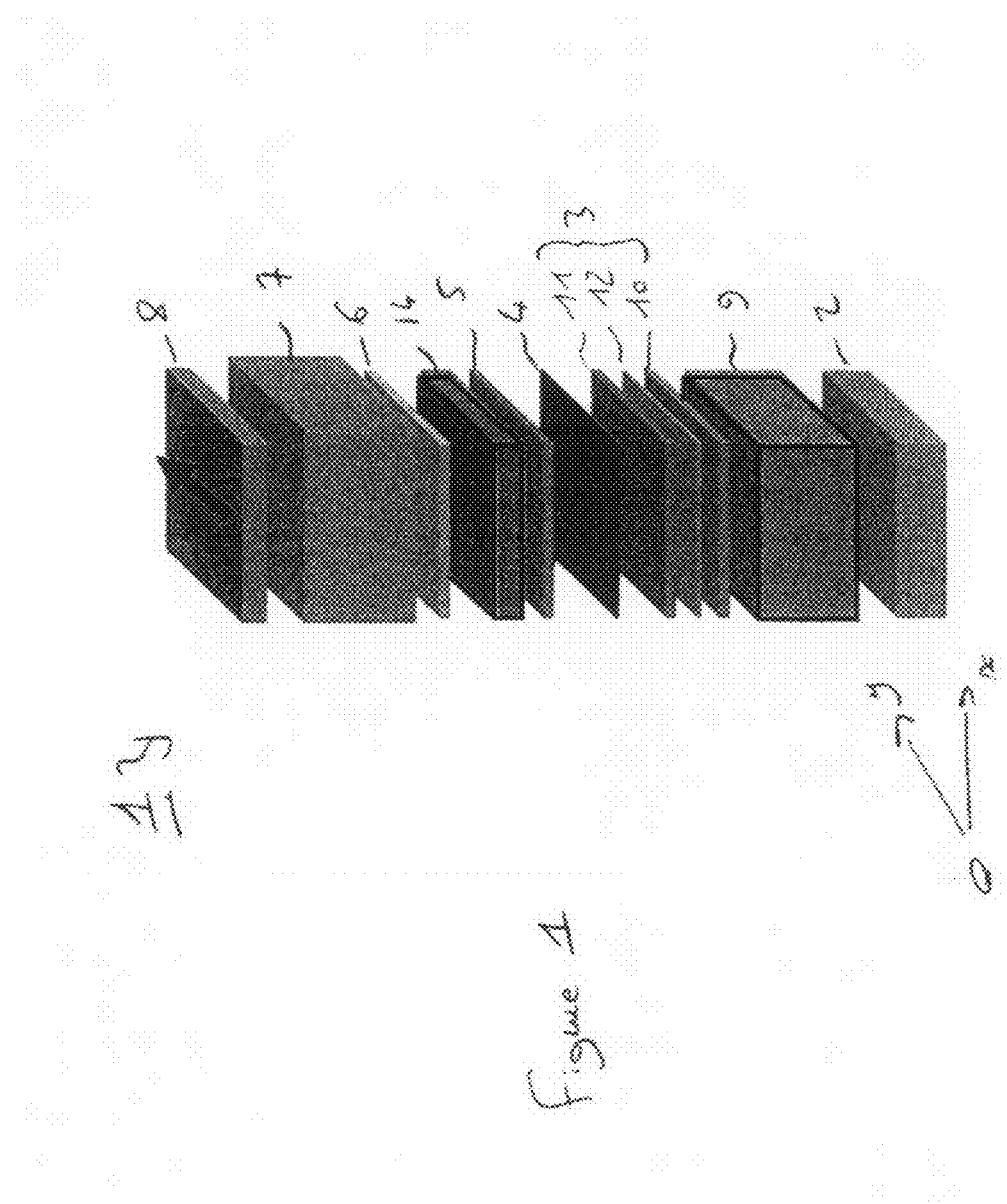

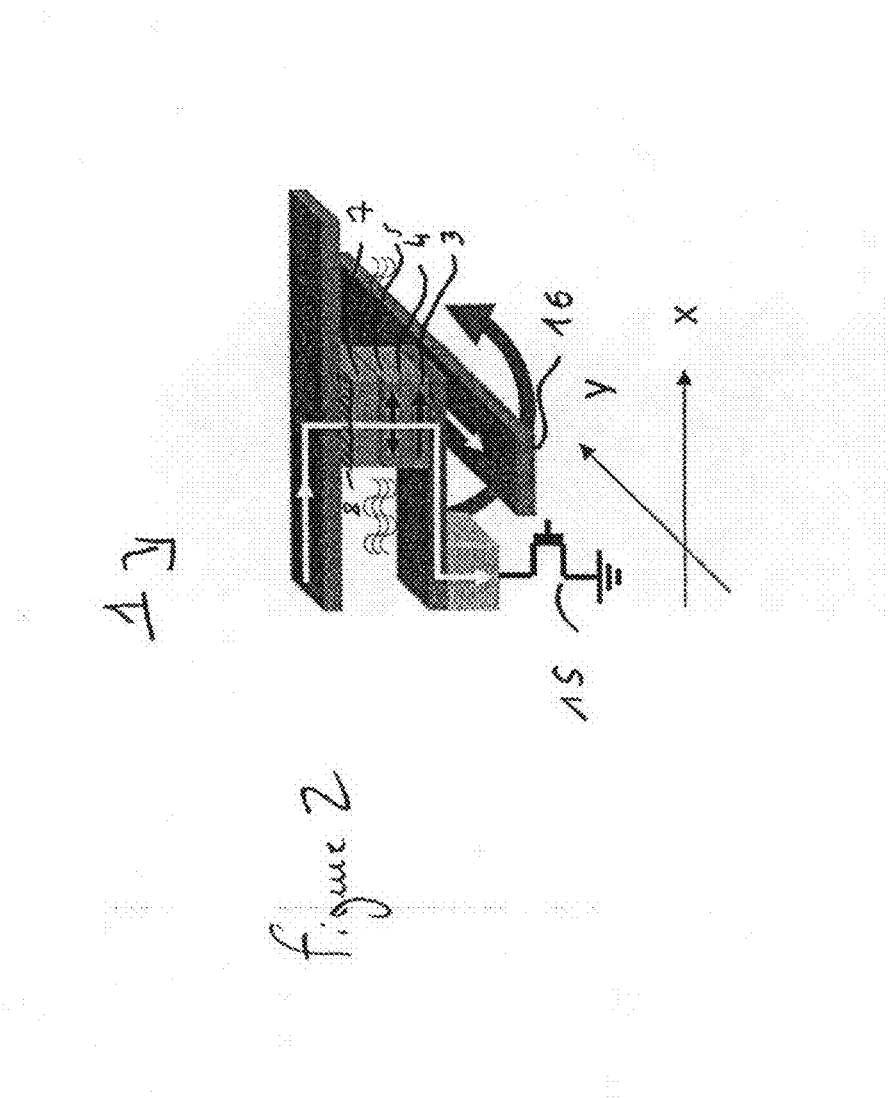

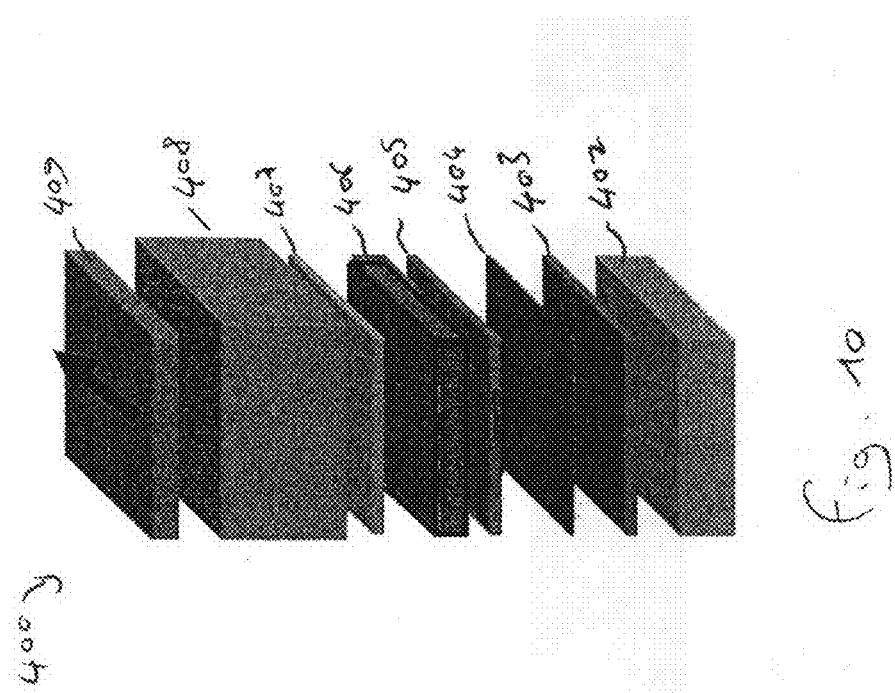

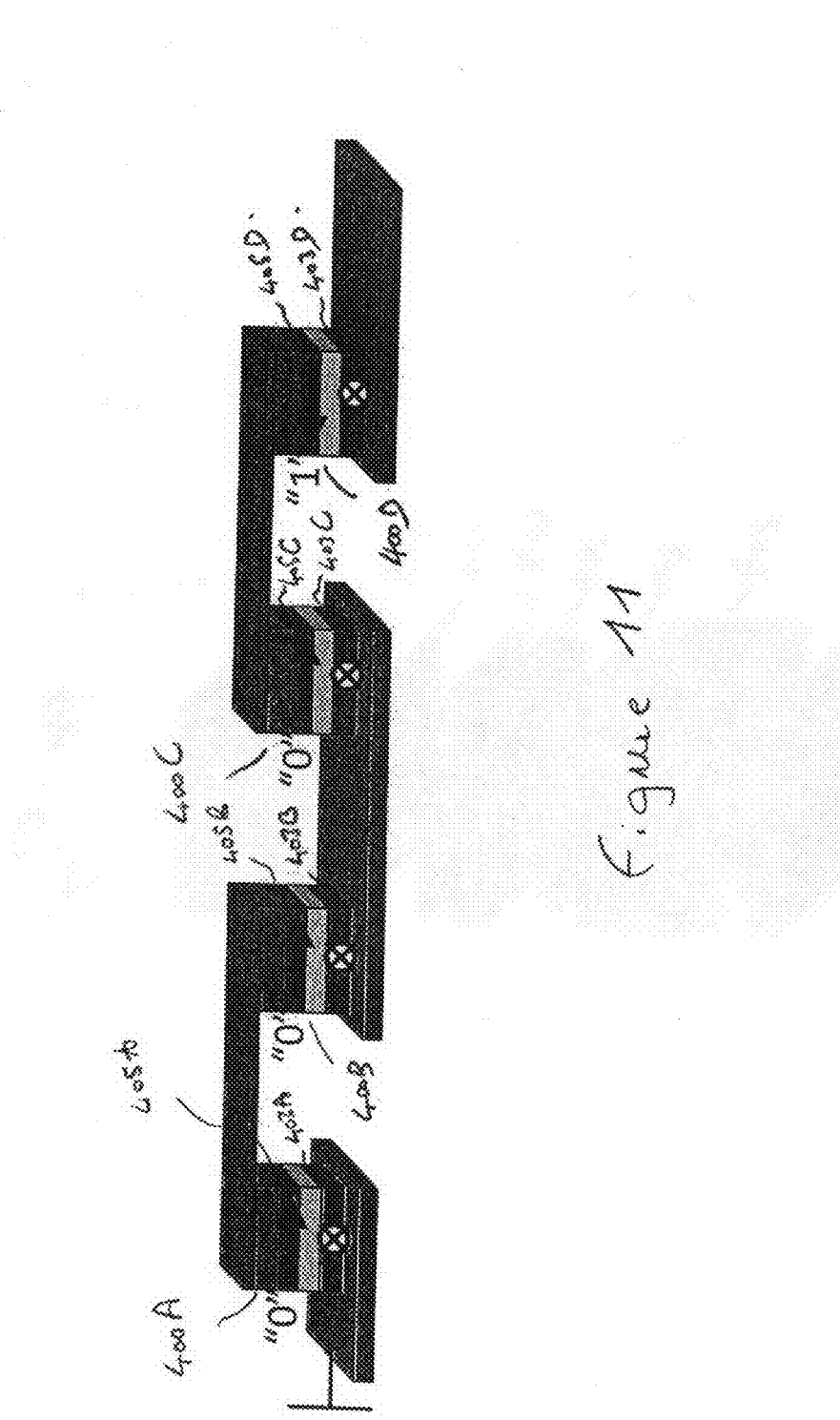

MAGNETIC DEVICE WITH THERMALLY-ASSISTED SWITCHING

CROSS-REFERENCE TO RELATED APPLICATIONS

This application is based upon and claims the benefit of priority from French Patent Application No. 1256670, filed Jul. 11, 2012, the entire content of which is incorporated herein by reference.

This invention relates to a magnetic device with thermally-assisted switching of the MRAM (Magnetic Random Access Memory) or Magnetic Logic Unit type based on magnetoresistive magnetic elements with thermally-assisted switching.

Interest in MRAM magnetic memories has revived following the development of the Magnetic Tunnel Junction (MTJ) with high magnetoresistance at ambient temperature. MRAM memories comprise several memory points. These memory points are generally magnetic devices that generally comprise a stack including:

- a magnetic layer called the <<reference layer>> that is magnetised along a fixed direction;
- a magnetic layer called the <<storage layer>> that is magnetised along a variable direction and that can be oriented either parallel or anti-parallel to the magnetisation direction of the reference layer;
- a spacer made from an electrically insulating or semiconducting material that separates the reference layer and the storage layer.

For example, document FR2817999 describes such a magnetic device. This magnetic device has two operating modes, namely a <<read>> mode and a <<write>> mode. In write mode, a current of electrons or a magnetic field is sent through the layers, to provoke switching of the direction of magnetisation of the storage layer, that then becomes parallel or antiparallel to the direction of magnetisation of the reference layer. A <<1>> or a <<0>> is stored in the storage layer depending on whether the direction of magnetisation of the storage layer is parallel or antiparallel to the direction of magnetisation of the reference layer.

In read mode, a current of electrons is injected through the magnetic device so as to read its resistance. When the directions of magnetisation of the reference and the storage layers are parallel, the resistance of the junction is low, while when the directions of magnetisation of the reference and storage layers are antiparallel, the resistance of the junction is high. The value stored in the storage layer (<<0>> or <<1>>) can be determined by comparing with the value of a reference resistance.

Document FR2924851 also proposes to add an antiferromagnetic layer to the previously described device at the contact with the storage layer. When not in write mode and particularly when in read mode, this antiferromagnetic layer can fix the direction of magnetisation of the storage layer so that information stored in the storage layer does not change. On the contrary in write mode, the antiferromagnetic layer is heated so that it becomes paramagnetic or at least until its temperature exceeds the so-called blocking temperature of the antiferromagnetic layer. This blocking temperature is generally less than the Néel temperature of the antiferromagnetic material but it continues to become closer to the Néel temperature as the heating duration reduces to the order of a few nanoseconds. The Néel temperature of the antiferromagnetic material is the temperature at which the antiferromagnetic order disappears and above which the material behaves like a paramagnetic. When the temperature of the antiferromagnetic layer exceeds the blocking temperature, the direction of magnetisation of the storage layer can be modified because it is no longer pinned by the antiferromagnetic layer. Once the direction of magnetisation of the storage layer has been modified, heating of the antiferromagnetic layer is stopped. The antiferromagnetic layer then becomes antiferromagnetic once again. The direction of magnetisation of the storage layer is then pinned in the direction in which it was at the end of the write process. Magnetic devices that comprise such an antiferromagnetic layer and apply temporary heating of this layer at the time that the information is written are among devices called <<Thermally-assisted Switching>> (TAS) devices.

Magnetic devices with thermally-assisted switching are advantageous because they can reduce the risk of accidental writes when reading information contained in the storage layer. They also have a much better retention than devices that do not use thermal assistance, in other words they have a better capability of keeping written information over the long term.

However, in these devices with thermally-assisted switching, the magnetic stack is heated by a current passing through the tunnel barrier that causes heating comparable to the Joule effect produced more precisely by inelastic relaxation of hot electrons passing through the barrier by the tunnel effect. The heating power per unit area produced by the current passing through the tunnel barrier is given by $P=RA.j^2$ where RA is the product of resistance*junction area and j is the current density passing through the junction. Due to the tunnel magnetoresistance of magnetic tunnel junctions (MTJ), the product RA is different depending on whether the junction is in the parallel (P) or antiparallel (AP) magnetic configuration. If the TMR magnetoresistance is 100%, the RA of the antiparallel state is twice the RA of the parallel state.

One important problem intrinsic to TAS writing is that when it is required to write the storage layer of a memory or logic element, this element might equally well be in the parallel state P or in the antiparallel state AP. Therefore if a predetermined heating current density is imposed on the memory element, the element will be heated more if it were in the antiparallel state that it would have been if it were in the parallel state. Thus, if it is required to provoke a temperature rise of for example 180° C. to reach a writing temperature of 230° C. starting from an initial temperature of 50° C., a certain current density will have to be applied in the parallel alignment. If the element were in the antiparallel configuration and the same current density were applied, the temperature rise could be 1.5*180=270° C. so that the temperature of the element would be 320° C. which is very high. Such a temperature increase can degrade the structural quality of the stack and gradually depolarise the pinned reference layer.

One solution could be to measure the magnetic state of the junction before writing and adjust the current density depending on this magnetic state, but this would slow writing considerably because reading would be necessary before writing.

The same type of difficulty occurs for Magnetic Logic Unit (MLU) type magnetic devices with thermally-assisted switching. A plurality of MLU devices connected in series or in parallel is often used; these MLUs may be in different magnetic states, P or AP. For example, this is the case in NAND chains for making a CAM (<<Content Addressable Memory>>) that use MLUs connected in series. In this type of assembly of tunnel junctions connected in series or in parallel, the same current density necessarily circulates through the different elements regardless of whether they are in the P or AP configuration (if they are in series) or the same voltage is applied between their electrodes (if the elements are connected in parallel). Thus, the different MLUs in the P configuration will not react thermally in the same way as MLUs in the AP configuration for the same voltage or the same current. Therefore, like MRAM memories with TAS writing, there is a problem with underheating or overheating MLUs.

The invention aims to overcome the disadvantages of prior art by disclosing a magnetic device with thermally-assisted switching that eliminates the problem of the temperature rise dependent on the initial magnetic state of the storage layer.

To achieve this, the invention discloses a magnetic device with thermally-assisted switching comprising:
- a first magnetic layer called the <<reference layer>>;
- a second magnetic layer called the <<storage layer>> that has a variable direction of magnetisation;
- a spacer that separates the reference layer and the storage layer and magnetically decouples them;
- an antiferromagnetic pinning layer at the contact with the storage layer, the antiferromagnetic layer being capable of pinning the direction of magnetisation of the storage layer, said storage layer with at least two storage levels corresponding to the two stable pinned directions of magnetisation;
- means of heating said pinning layer so that, during heating, the temperature of said pinning layer exceeds its blocking temperature such that the direction of magnetisation of said storage layer is no longer pinned;
- means of applying a writing magnetic torque tending to align the magnetisation of the storage layer along one of the two stable magnetisation directions once said blocking temperature is reached;

said device being characterised in that it comprises means of applying a magnetic polarisation field at least during the heating phase before the blocking temperature is reached, such that the direction of magnetisation of said storage layer is always along the direction of said magnetic polarisation field at the moment that the blocking temperature is reached.

It should be noted that the invention is equally applicable to MRAM memory type devices and to MLU logic elements, provided that they use thermally-assisted switching.

According to the invention, means are used to apply a polarisation field (also called a bias field) to the storage layer of the memory or logic element written using TAS, at least during the write-related heating phase such that during the heating phase (which is done with no applied writing field other than this bias field), the magnetic configuration of the storage layer changes to a single configuration regardless of the initial configuration of the storage layer before the beginning of the heating phase. The heating phase forms the phase during which the temperature of the stack increases such that the temperature of the antiferromagnetic pinning layer exceeds its blocking temperature such that the direction of magnetisation of the storage layer is no longer pinned. According to one particularly advantageous embodiment of the invention, the polarisation field is oriented along a direction transverse to the possible equilibrium directions of magnetisation of the storage layer at rest.

The device according to the invention also comprises means of applying the writing magnetic torque, which may be either a writing magnetic field (different from the bias field) or the spin transfer torque applied by the heating current, once the heating phase is complete and before cooling begins or at least before the storage layer drops below its blocking temperature; it is obvious that the blocking temperature depends on the duration of the heating pulse considered.

The device according to the invention is equally applicable to systems with in-plane and perpendicular magnetisation, with pinned reference layer or soft reference layer.

The device according to the invention may also have one or more of the following characteristics, taken individually or in any technically possible combination:
- said means of applying a writing magnetic torque are means of applying a writing magnetic field tending to align the magnetisation of the storage layer along one of the two stable magnetisation directions once said blocking temperature is reached.
- the amplitude of the polarisation field is between 10% and 120% of the amplitude of the writing magnetic field and is preferably between 25% and 120% of the amplitude of the writing magnetic field;
- the direction of said magnetic polarisation field is different from said two stable pinned directions of magnetisation;
- the direction of the polarisation field is approximately perpendicular to the stable pinned directions of magnetisation;
- said means of applying a magnetic polarisation field are formed from a layer of hard ferromagnetic material located close to said storage layer;
- said means of applying a magnetic polarisation field are formed by a layer of ferromagnetic material, the magnetisation of which is pinned by an antiferromagnetic layer, which is located close to said storage layer;
- said means of applying a magnetic polarisation field at least during the heating phase before the blocking temperature is reached are formed by at least one layer of natural or artificial ferrimagnetic material for which the magnetisation increases significantly as its temperature gets closer to said blocking temperature and reduces at a lower temperature;
- said means of applying a magnetic polarisation field at least during the heating phase before the blocking temperature is reached, are formed by a conducting field generating line in which a current circulates;
- the magnetic storage and reference layers have a direction of magnetisation outside the plane of said layers, said magnetic polarisation field being parallel to the plane of the magnetic layers.

Another purpose of this invention is a magnetic memory comprising a plurality of memory points, each memory point being a magnetic device according to the invention.

Another purpose of this invention is a logic unit comprising a plurality of logic elements connected in series or in parallel, each logic element being a magnetic device according to the invention.

Another purpose of this invention is a method of writing information in the storage layer of a device according to the invention, characterised in that it comprises the following steps:
- application of a polarisation field without a writing field while injecting a current in said device so as to heat it to reach the blocking temperature of said pinning layer;
- once the blocking temperature has been reached, apply a writing magnetic torque to the magnetisation of the storage layer to orient the magnetisation of the storage layer along one of the two stable directions of magnetisation. This magnetic torque may be exerted by applying a writing magnetic field or by using the spin transfer torque exerted by the heating current that is naturally spin-polarised by passing through the tunnel junction. In the latter case, the two stable directions of magnetisation can be reached by varying the direction of the heating current passing through the tunnel barrier. If the electrons pass through the tunnel barrier from the reference layer to the storage layer, parallel alignment of the magnetisations of the reference and storage layers will be facilitated. If the electrons pass through the tunnel barrier from the storage layer to the reference layer, the antiparallel alignment will be facilitated.

Other characteristics and advantages of the invention will become clear after reading the following description, with reference to the appended figures:

Identical or similar elements are identified by the same reference marks on all figures, to make it easier to understand the figures.

FIG. 1 represents a magnetic device 1 with thermally-assisted switching according to a first embodiment of the invention.

Figure 3:
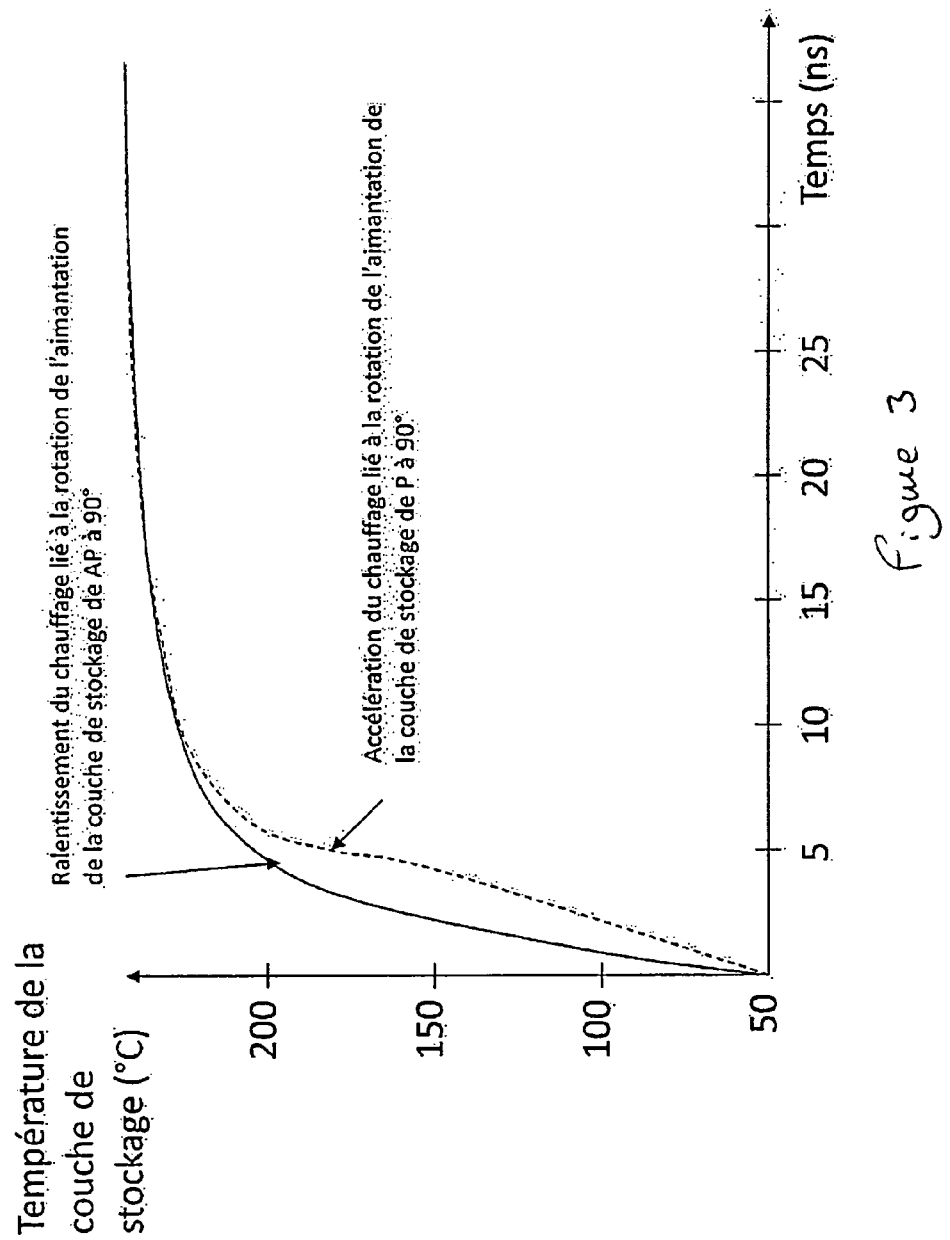
FIG. 3 shows the heating dynamics of the device in FIG. 1 during writing as a function of the initial magnetic state of the device.

The device 1 comprises the following in sequence:
a buffer layer 2;
a first antiferromagnetic layer 9;
a reference layer 3;
a spacer 4;
a storage layer 5 separated from the reference layer 3 by said spacer 4;
a second antiferromagnetic layer 14
a functional layer related to manufacturing 6;
an adaptation layer 7;
a polarisation layer 8.

The reference layer 3 in this case is a synthetic triple antiferromagnetic layer composed of two magnetic layers 10 and 11 separated by a non-magnetic conducting layer 12 capable of inducing an antiparallel alignment between magnetisations of adjacent magnetic layers.

The first antiferromagnetic layer 9 may be made for example from PtMn with a thickness of between 12 and 30 nm or from NiMn with a thickness of between 20 nm and 50 nm. The first antiferromagnetic layer 9 is preferably made from an antiferromagnetic material that has a high blocking temperature, typically more than 370° C. The materials mentioned above for the antiferromagnetic layer 9 are only given for illustrative purposes and other materials could be used without going outside the scope of the invention.

The magnetic layer 10 may for example be composed of a cobalt-iron alloy, while the magnetic layer 11 could also be composed of a CoFe alloy, or possibly a composition different from the layer 10 or of cobalt-iron-boron particularly if the spacer 4 is an MgO tunnel barrier. The two magnetic layers 10 and 11 could also be made from the same magnetic alloy. Each magnetic layer 10 and 11 is preferably between 1 and 4 nm thick. The two magnetic layers 10 and 11 preferably have similar magnetic moments, so that the field radiated by the two magnetic layers 10 and 11 at the storage layer 5 is as weak as possible.

The non-magnetic conducting layer 12 may for example be made from ruthenium between 0.5 nm and 0.9 nm thick, and at these thicknesses it is known that ruthenium induces antiparallel coupling between magnetisations of adjacent magnetic layers. The two magnetic layers 10 and 11 are coupled in antiparallel through the non-magnetic conducting layer 12. The direction of magnetisation of the two magnetic layers 10 and 11 is fixed by the first antiferromagnetic layer 9, as long as the temperature of the magnetic device is less than the blocking temperature of the antiferromagnetic material that forms the first antiferromagnetic layer 9. The materials from which a reference layer is made are well known to those skilled in the art and are only mentioned herein for guidance, without forming any restriction for the invention.

The magnetic device then comprises the storage layer 5 separated from the reference layer 3 by the spacer 4. The spacer 4 may be a tunnel barrier selected from among the group including aluminium oxides $AlO_x$, titanium oxides $TiO_x$ and magnesium oxide MgO. Alternately, the spacer 4 may be composed of a semiconductor. Thus, the spacer may be composed of silicon, germanium or GaAs. The spacer 4 can also be made from a heterogeneous metal/oxide layer such as a layer with confined current paths composed of an insulating barrier, made for example from 2 nm thick alumina through which conducting channels pass for example of copper with nanometric diameter, typically between 1 and 4 nm. The spacer 4 is preferably between 0.6 nm and 5 nm thick.

The storage layer 5 is a magnetic layer that has a variable direction of magnetisation. This storage layer 5 may be a single magnetic layer or a stack of layers. The storage layer 5 may for example be composed of a stack of layers comprising:
a layer composed of a ferromagnetic material with a face-centred cubic crystallographic structure at the contact with the second antiferromagnetic layer 14;
an amorphous or semi-amorphous structure transition layer at the contact with the ferromagnetic layer with a face-centred cubic crystallographic structure;
a ferromagnetic face-centred cubic crystallographic layer, for example an Fe-rich CoFe alloy or a layer of amorphous CoFeB at the time that the layers are deposited but that crystallises in face-centred cubic form when the stack is annealed.

This type of storage layer is particularly attractive in the case in which the spacer 4 is an MgO-based tunnel barrier, with a face-centred cubic crystallographic structure.

The storage layer 5 may also be composed of a synthetic triple antiferromagnetic stack.

Figure 1:
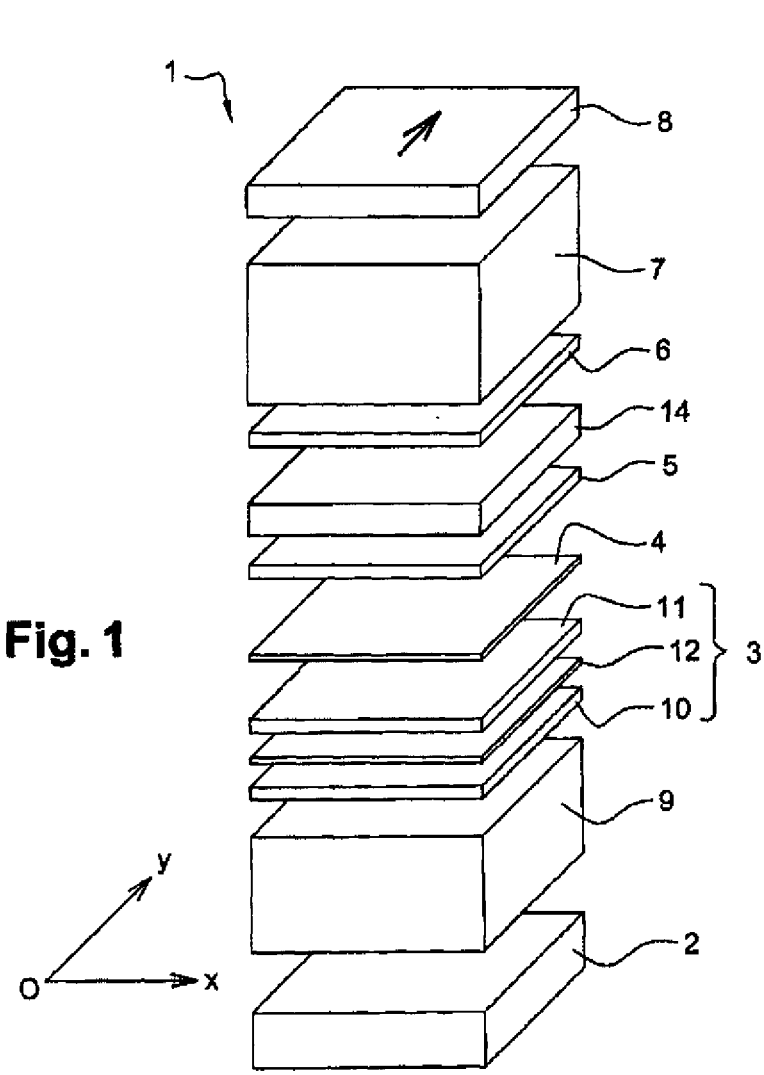
FIG. 1 illustrates a first embodiment of a magnetic device according to the invention.

In the example in FIG. 1, the storage layer 5 is composed of a single layer, followed by the second antiferromagnetic layer 14. This single layer may for example be composed of a cobalt-iron-boron alloy. The storage layer is preferably between 1 and 4 nm thick.

Obviously, the characteristics of the storage layer are given here only for guidance, and those skilled in the art would be capable of adapting the invention to other types of storage layers.

The second antiferromagnetic layer 14 makes it possible to pin the direction of magnetisation of the storage layer 5 when reading, and to release the direction of magnetisation of the storage layer 5 when writing. For example, the second antiferromagnetic layer 14 may be made of IrMn between 5 and 7 nm thick. The blocking temperature of the second antiferromagnetic layer 14 is preferably high enough so that if there is no heating, the second antiferromagnetic layer 14 efficiently pins the direction of magnetisation of the storage layer 5 over the entire operating temperature range of the device. However, this blocking temperature must not be too high otherwise it would be too difficult to release the direction of magnetisation of the storage layer 5, and also so that the direction of magnetisation of the storage layer 5 can be released without releasing the direction of magnetisation of the reference layer 3. Thus, the blocking temperature of the second antiferromagnetic layer 14 is preferably between 200 and 300° C.

The magnetic device 1 according to the invention also comprises a polarisation layer 8 to apply a magnetic polarisation field such that the direction of magnetisation of the storage layer 5 is always in the direction of said magnetic polarisation field when the blocking temperature of the second antiferromagnetic layer 14 is reached.

The buffer layer 2 acts as a base for the growth of the other layers of the magnetic device. This buffer layer 2 is preferably made from a non-magnetic material. In this case, the layer 2 is a tantalum layer or a multi-layer based on Ta and Ru possibly with a thickness of 1 to 50 nm each. Obviously, this material is only mentioned for guidance, and in way restricts the invention.

Figure 2:
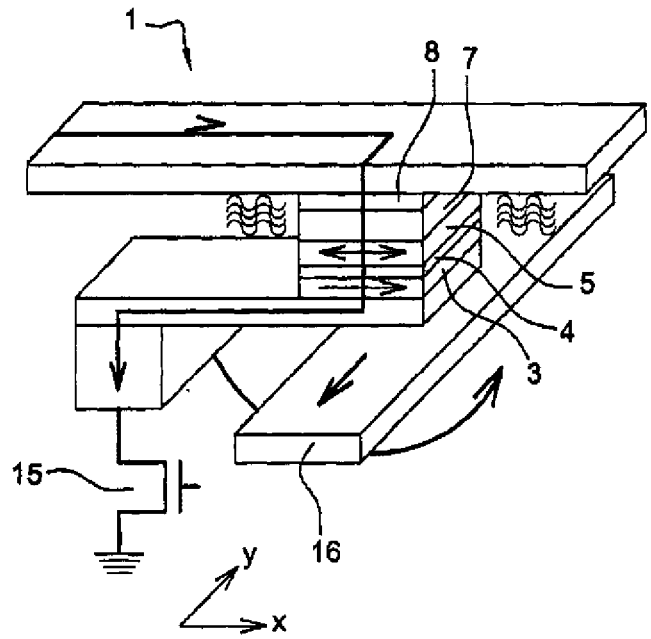
FIG. 2 illustrates writing of the device in FIG. 1.
Figure 3:
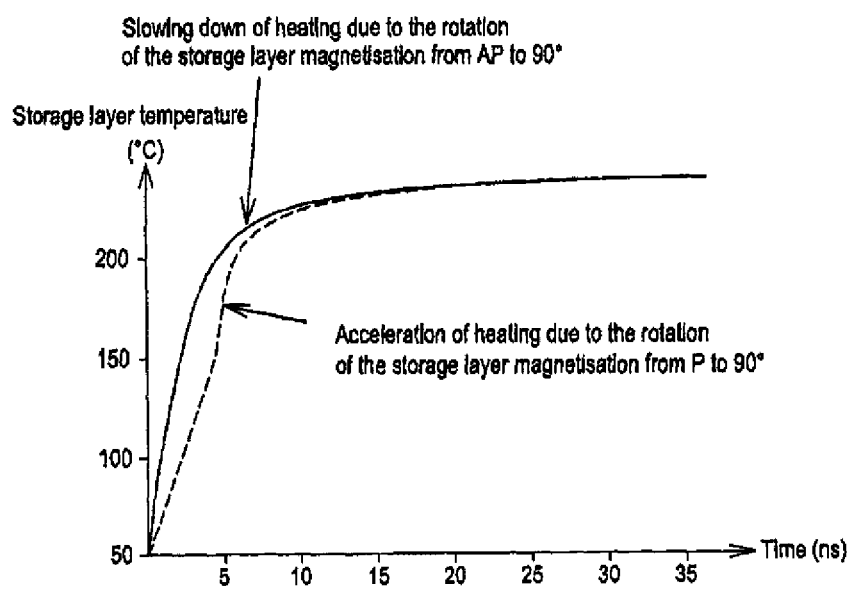
Figure 4:
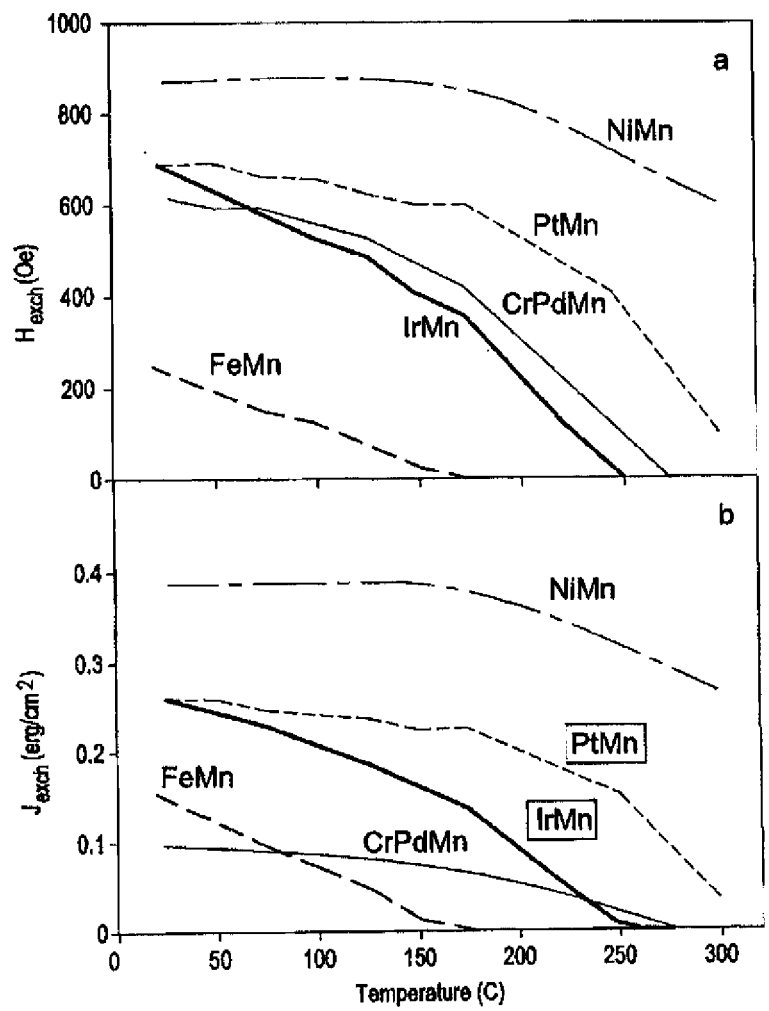
Figure 7:
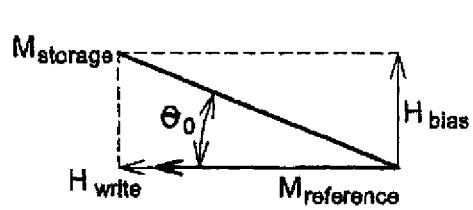
Figure 7:
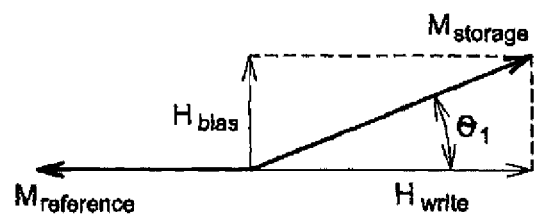
Figure 7:
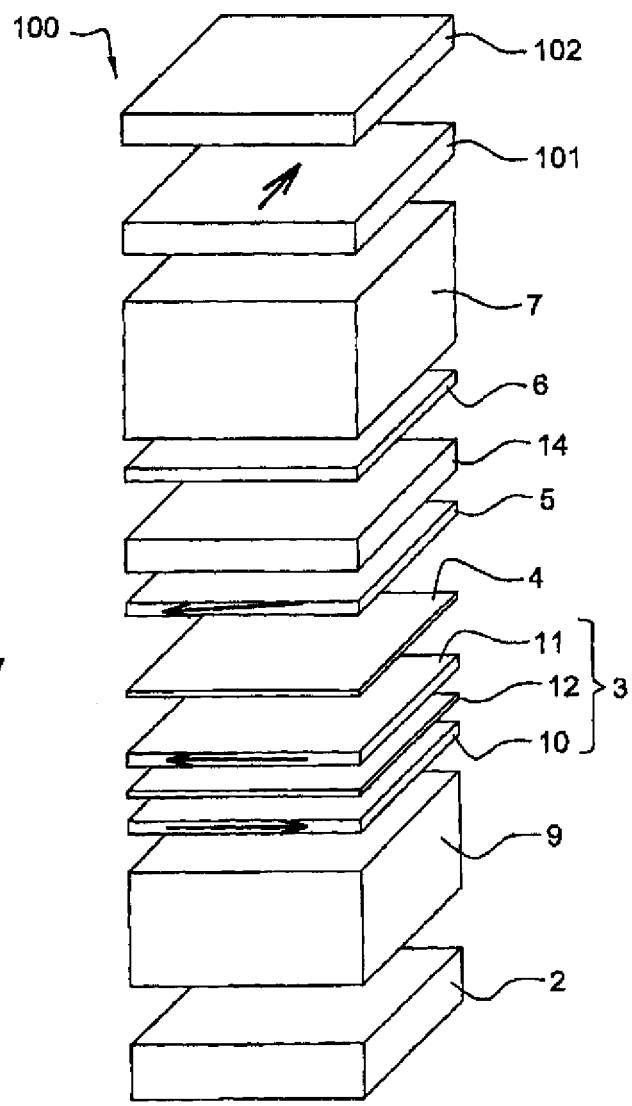
Figure 8:
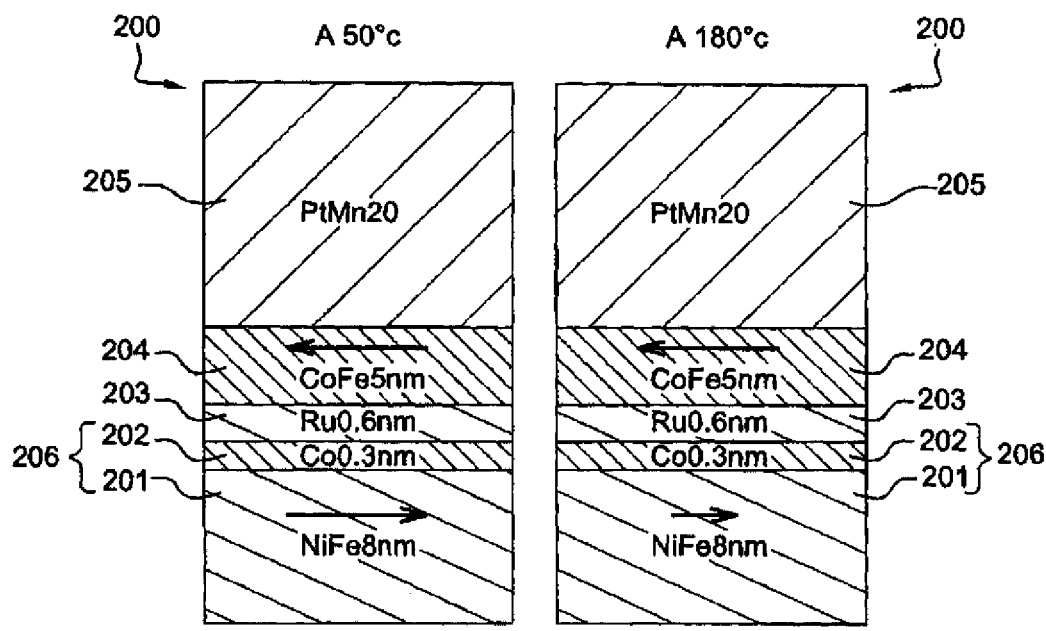
Figure 9:
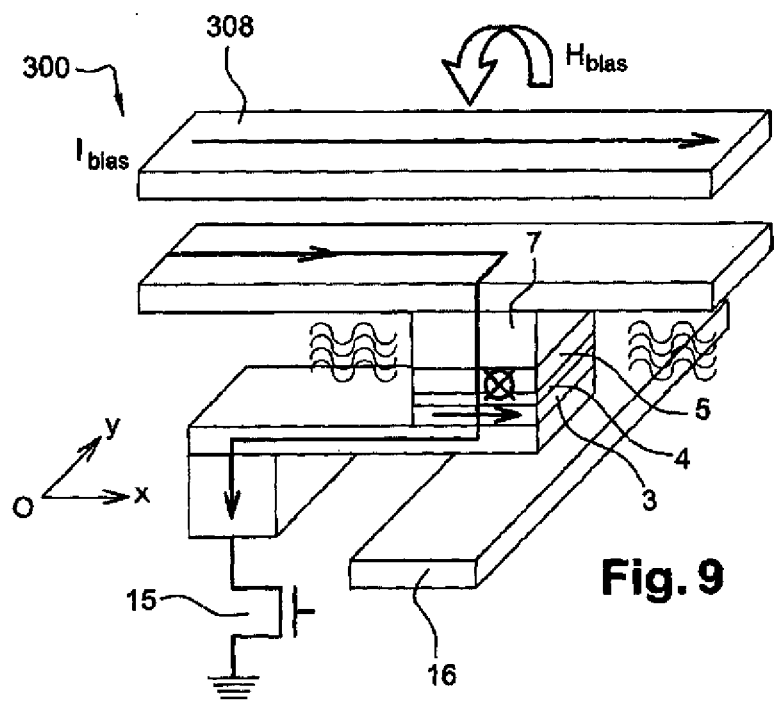

FIG. 2 illustrates a write operation of the magnetic device 1 with thermally-assisted switching.

Only the storage layer 5, the reference layer 3, the spacer 4, the adaptation layer 7 and the polarisation layer 8 are shown for simplification reasons.

The direction of magnetisation of the reference layer is pinned in the plane of the reference layer 3. This can be illustrated by considering that the magnetisation of the reference layer 3 pinned by its first antiferromagnetic layer is along the +Ox direction in the Oxy plane coordinate system parallel to the planes of the layers in the stack.

The storage layer 5 has a variable direction of magnetisation with two stable magnetisation directions: the first lies approximately along +Ox (P state) and the second approximately along −Ox (AP state).

The principle of the invention depends particularly on the presence of a means (in fact the polarisation layer 8) for applying a polarisation field (also called the bias field) oriented along the Oy or −Oy direction, therefore perpendicular to the possible directions of magnetisation of the storage layer 5 at rest (parallel to the plane of the layers).

In FIG. 1, the polarisation layer 8 is a layer of hard $Co_{80}Cr_{20}$ material a few nanometres thick (for example 5 nm) forming a permanent magnet creating a transverse polarisation field along the Oy direction. The <<hardness>> of a magnetic layer is defined relative to the value of the coercive magnetic field necessary to switch the magnetisation of the layer. Therefore such a magnetic layer will be said to be <<harder>> if its coercive field is stronger.

This polarisation field has a negligible influence on the orientation of the magnetisation of the reference layer 3 because it is strongly pinned by the interaction with the first antiferromagnetic layer 9. If the reference layer 3 is also a synthetic antiferromagnetic layer, the influence of the polarisation field is even further reduced because the magnetic moment of the reference layer 3 is globally low. The hard material layer 8 must be sufficiently far from the spacer acting as a tunnel barrier 4 to avoid heating to the extent that this layer is demagnetised during operation of the device. This is the purpose of the thick adaptation layer 7, for example made from Ta. This layer 7 may also act as a thermal barrier in the stack so that heat produced close to the tunnel barrier at the time of the write can be better confined. It will be noted that this layer 8 of hard material could also be under the device, since the ferromagnetic material NiMn in the first antiferromagnetic layer 9 forms a good thermal barrier to diffusion of heat, provided that the polarisation field that it radiates allows orientation of magnetisation of the storage layer during the heating phase. It will also be noted that the current injected through the stack does not necessarily pass through this layer. The adaptation layer 7 is also used to adjust the distance between the transverse polarisation layer 8 and the storage layer 5, thereby adjusting the value of the field radiated by the polarisation layer on the storage layer.

The functional layer 6 may for example be a thin layer of Ru (for example 2 nm). This layer 6 is a purely functional layer used in the tunnel junction etching process to know when the bottom of the upper Ta electrode is reached, and when the second antiferromagnetic layer starts to be etched. Therefore, it is no more than a detection layer in the etching process and would not be necessary if a different etching process is used.

As mentioned above, it would also be possible to envisage the use of a thermal barrier layer (for example made of BiTe or GeSbTe) inserted between the second antiferromagnetic layer 14 and the layer of hard material 8 (in addition to or instead of the Ta layer 7).

The magnetic device comprises a transistor 15 that conducts in write mode and that carries a current perpendicular to the stack so that information can be written in the storage layer 5. The magnetic device also comprises a conducting line 16 located below the magnetic stack. The conducting line 16 is arranged such that when an electric current passes through it, it creates a sufficiently strong magnetic field to switch magnetisation of the storage layer 3 into one of its two stable positions P or AP.

When writing, the transistor 15 is in conducting mode such that current can pass through the stack, causing heating of the storage layer and the first antiferromagnetic layer by the Joule effect.

During this heating phase, the polarisation field created by the layer 8 is applied to the stack; as will be described later, this polarisation field can be applied permanently (case of a permanent magnet as in the case shown in FIG. 1) or only during the heating phase.

Under the effect of this transverse bias field, since pinning of the storage layer 5 by the second antiferromagnetic layer 14 decreases as the stack temperature increases, magnetisation of the storage layer 5 will be oriented perpendicular to magnetisation of the reference layer 3, regardless of its initial orientation P or AP to magnetisation of the reference layer 3.

Consequently, the resistance of the tunnel junction will spontaneously adjust during the write to a unique value intermediate between the resistance of the junction in the P state and its resistance in the AP state. More precisely, in the tunnel magnetoresistances MTJ, the conductance G (inverse of the resistance R, $G=1/R$) varies as the cosine of the angle between magnetisations of the storage layer 5 and the reference layer 3. Consequently, with an angle equal to 90°, the conductance of the junction is precisely at the mid-point between the conductance corresponding to a parallel situation and the conductance corresponding to an antiparallel situation:

If this conductance at 90° is denoted $G_0$, we have $G_0=\frac{1}{2}(G_P+G_{AP})$ or in other words $1/R_0=\frac{1}{2}(1/R_P+1/R_{AP})$, the subscripts P and AP referring to the P and AP configurations respectively.

Due to this spontaneous reorientation of the magnetisation of the storage layer 5 during the heating phase always along the same direction regardless of the initial state of the device, the asymptotic temperature reached by the device for a given current density will be the same, regardless of its initial state. Therefore this configuration solves the problem of the temperature rise dependent on the initial state of the device. All that will change is the heating rate depending on the initial state of the device, but not the final temperature reached.

The heating rate is illustrated in FIG. 3 that shows the variation in the temperature of the storage layer as a function of time for two initial states, namely P (dashed line curve) and AP (solid line curve).

If the device 1 is initially in the antiparallel state, the initial heating power per surface element is given by the relation $P=(RA)_{AP}(V) \cdot j^2$ where $(RA)_{AP}(V)$ is the product of the resistance*surface area of the MTJ in the AP state at the heating voltage V and j is the current density passing through the device. This relation can also be written $P=(A/G)_{AP}(V) \cdot j^2$, where $(G/A)_{AP}(V)$ is the conductance per unit area of the MTJ in the AP alignment at voltage V.

On the other hand, if the device 1 is in the parallel state, the initial heating power per surface element is given by the relation $P=(RA)_P(V) \cdot j^2$ where $(RA)_P(V)$ is the product of the resistance*surface area of the MTJ in the P state at the heating voltage V. This relation can also be written $P=(A/G)_P(V) \cdot j^2$, where $(G/A)_P(V)$ represents the conductance per unit area of the MTJ in the P alignment at voltage V.

If heating is current-controlled, in other words if a given heating current is imposed (heating current=j*section of the tunnel junction), and since $R_{AP}$ is usually higher than $R_P$, the initial heating of the MTJ will initially be faster starting from the AP initial configuration and the heating power will then automatically drop towards $P=(RA)_0(V) \cdot j^2$ when magnetisation of the storage layer 5 turns towards the polarisation field, $(RA)_0(V)$ denoting the product of the resistance*surface area of the MTJ for an angle of 90° between magnetisations of the storage layer 5 and the reference layer 3. In other words, after a fast change of heating dependent on the initial AP configuration, heating is slowed due to rotation of the magnetisation of the storage layer 5 from AP to 90° from the reference layer 3.

On the contrary, the temperature rise will be slower starting from the P configuration but the heating power will increase to $P=(RA)_0(V) \cdot j^2$ when the magnetisation of the storage layer 5 rotates and turns towards the polarisation field. In other words, after a slow change of heating dependent on the initial P configuration, heating is accelerated due to rotation of the magnetisation of the storage layer 5 from P to 90° from the reference layer 3.

Figure 4:
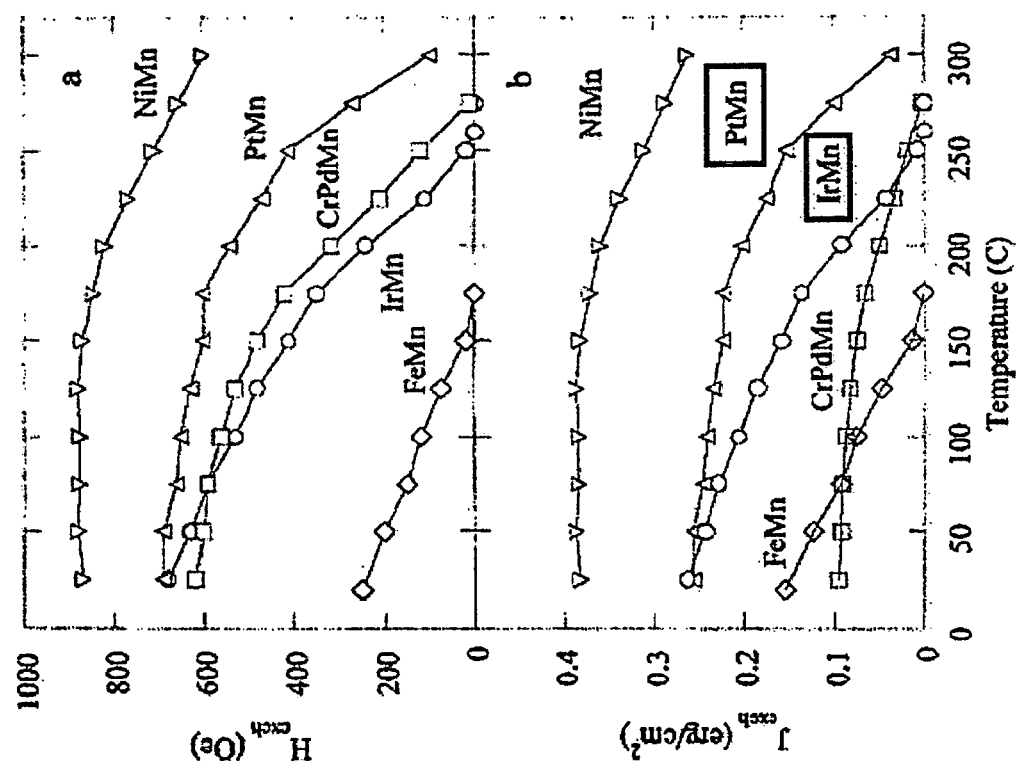
FIG. 4 illustrates the variation of the pinning field and the interface pinning energy of the dual ferromagnetic/antiferromagnetic layer with temperature for different antiferromagnetic materials.

This rotation of the magnetisation of the storage layer 5 towards the polarisation field is the result of the decrease in the pinning field with temperature by the second antiferromagnetic layer 14, as shown in FIG. 4 for different antiferromagnetic materials.

Therefore, regardless of the initial situation, it is found that due to the gradual decrease of the pinning field with temperature, the reorientation of the magnetisation of the storage layer 5 takes place progressively as the temperature rises but the heating power becomes the same in the end regardless of the initial state and therefore the asymptotic temperature becomes the same after a few nanoseconds (typically 10 ns) under usual operating conditions of TAS type MRAM devices (specifically $(RA)_P \sim 30\Omega \cdot \mu m^2$ and $j \sim 2 \times 10^6$ A/cm$^2$).

Exactly the same reasoning will be described later for MLU devices.

In some less frequent cases, the resistance $R_{AP}$ is less than the resistance $R_P$, but the above reasoning remains applicable by inverting the references P and AP.

If heating is voltage-controlled, the heating power per unit area in the antiparallel alignment can be written by the relation $P=V^2/(RA)_{AP}(V)$ and in the parallel state can be written by the relation $P=V^2/(RA)_P(V)$. In this case, the magnetoresistance MTJ will heat more initially in the P state than in the AP state but the heating powers will come into equilibrium once again after rotation of the magnetisation of the storage layer along the direction of the polarisation field.

Once the heating phase is complete, a temperature equal to or greater than the blocking temperature of the second antiferromagnetic layer will be reached.

Information is written in the storage layer 5 by sending a current through the conductor 16 so as to create a magnetic field that will orient the magnetisation of the storage layer 5 either in the P configuration P or in the AP configuration. As soon as the magnetisation of the storage layer is oriented in this new direction (typically 3 ns after application of the magnetic field), the heating current passing through the transistor 15 can be cut off such that the storage layer and the adjacent antiferromagnetic layer 14 are cooled in the applied field. The current in the conductor 16 is then cut off to cancel the applied field. Since the second antiferromagnetic layer 14 has once again become antiferromagnetic, it pins the direction of magnetisation of the storage layer 5 in its current direction.

Alternately, the spin transfer torque exerted by the heating current on the magnetisation of the storage layer 5 can also be used instead of using a magnetic field to orient magnetisation of the storage layer 5 either in the P configuration or in the AP configuration. This heating current is naturally spin-polarised by passing through the tunnel barrier. If its density is high enough (typically of the order of 1 to $4 \times 10^6$ A/cm$^2$), it will orient magnetisation of the storage layer to the P configuration or the AP configuration depending on its direction through the tunnel junction. If the electrons associated with this current move from the reference layer to the storage layer, the P configuration will be facilitated. If the electrons associated with this current move from the storage layer to the reference layer, the AP configuration will be facilitated. If the spin transfer torque associated with the heating current is used to switch the magnetisation of the storage layer, then the conductor 16 is not necessary to create the writing magnetic field.

If the write is made using the spin transfer torque instead of the torque due to a magnetic field, the heating current should progressively be reduced for example in a few nanoseconds so that the spin transfer torque can still be effective during cooling of the tunnel junction.

It should be noted that magnetisation of the reference layer 3 does not change during this write because it is pinned by the first antiferromagnetic layer 9 for which the blocking temperature is higher than the blocking temperature of the second antiferromagnetic layer 14.

For energy consumption reasons, the writing field is preferably applied near the end of the heating phase (i.e. after the blocking temperature has been reached) and before cooling begins (or at least before the temperature of the second antiferromagnetic layer drops below the blocking temperature, this blocking temperature being applied for the duration of the heating pulse considered).

As mentioned above, according to this first embodiment, the polarisation field is created by means of a layer of hard material located close to the tunnel junction. It will be noted that this layer of hard material forming a permanent magnet may be in the stack, above the stack (as shown in FIG. 1) or below it. The characteristics of this layer (magnetisation, dimension, position relative to the junction) must be adjusted such that the polarisation field produced at the storage layer is sufficient to orient the magnetisation of the storage layer approximately transverse to the magnetisation of the reference layer.

According to this first embodiment, the polarisation field is applied permanently because it is created herein by a layer of hard material (permanent magnet); therefore it is desirable that this field should be not too strong relative to the writing field so that the misalignment of the magnetisation of the storage layer relative to the writing field is not too strong at the time of the write. Typically, the value of the bias field can be assumed to be approximately half the writing field.

In general, the amplitude of the polarisation field may preferably be between 25% and 120% of the amplitude of the writing field and more preferably between 30% and 75% of the writing field. If the polarisation field is too weak, it might not be sufficient to polarise the magnetisation of the storage layer in the same state regardless of the initial state before heating is started. On the contrary, if the field is too strong relative to the writing field, magnetisation of the storage layer could deviate from the P or AP alignment with the magnetisation of the reference layer excessively, such that the amplitude of the magnetoresistance between the two states "0" and "1" will be strongly reduced.

The consequence of the bias field on misalignment in terms of loss of magnetoresistance because switching is not made from the perfect parallel alignment to the perfect antiparallel alignment is not critical.

Figure 6:
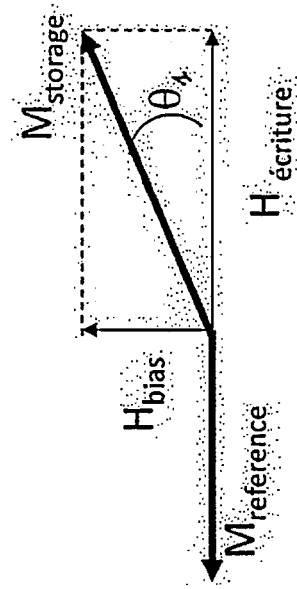
FIGS. 5 and 6 illustrate the effect of the polarisation layer of the device in FIG. 1 on misalignment of the magnetisation of the storage layer for the parallel and antiparallel configurations depending on the magnetisation of the reference layer.
Figure 5:
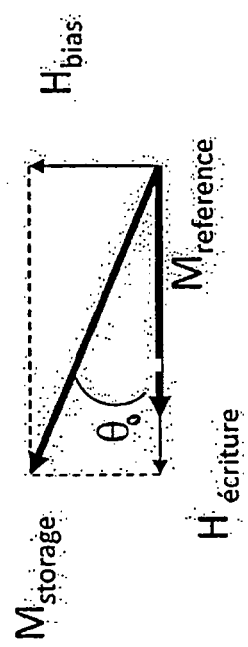

Thus, if it assumed for example that the amplitude $H_{bias}$ of the polarisation field is equal to half the amplitude of the writing field $H_{write}$, then the misalignment angle θ between a reference magnetisation $M_{reference}$ and the magnetisation $M_{storage}$ of the storage layer in the device according to the invention is given by tan θ=Hbias/Hwrite=1/2 namely θ=26° (see FIGS. 5 and 6 that illustrate the effect of the polarisation layer of the device in FIG. 1 on the misalignment from the reference parallel and antiparallel configurations). In terms of magnetoresistance, this implies that the relative value of the magnetoresistance amplitude is 11% lower than its total amplitude would be when changing from a perfect parallel alignment to a perfect antiparallel alignment. In other words, if the amplitude between perfect P and AP configurations were 150%, this amplitude would still be equal to 133% in the presence of the bias field during the write: therefore the magnetoresistance amplitude remains very acceptable.

One ancillary advantage of the presence of the polarisation field during the write phase is that it makes the write much more reproducible. Due to this polarisation field, magnetisation rotates much more consistently than when this transverse polarisation field is not present. Consequently, the final micromagnetic state is better defined and is closer to a macrospin state or a <<leaf state>>).

The loss of magnetoresistance related to the presence of the polarisation field can be easily calculated using the following expression as above:
tan $θ_{0(1)}$=+(-)Hbias/Hwrite (where $θ_0$ and $θ_1$ denote the misalignment angles of the magnetisation of the storage layer from the parallel or antiparallel direction to the reference direction Ox due to the presence of the transverse bias field); knowing that the conductance G varies as a function of the angle θ between the magnetisation of the reference layer and the storage layer as defined in $$G(θ) = G_p - ΔG \frac{(1-\cosθ)}{2}$$

where ΔG represents the variation of conductance (magneto-conductance) between the perfect P and AP alignments.

In the presence of Hbias, the angle between the magnetisations varies from $θ_0$ to $θ_1$ when the magnetisation of the storage layer switches from one stable position to the other. The result is that the effective magnetoconductance $ΔG_{eff}$ is given by $$ΔG_{eff} = \frac{ΔG}{\sqrt{1+\left(\frac{H_{bias}}{H_{write}}\right)^2}}$$

Thus, if $H_{bias}$=0.25*$H_{write}$, the magnetoresistance TMR is 3% less than its total amplitude. If $H_{bias}$=0.5*$H_{write}$, the TMR is 11% less than its total amplitude.

The information contained in the storage layer 5 is read using methods known to those skilled in the art, particularly by determining the resistance of the device.

The first step to initialise the device 1 in FIG. 1 when the device is being manufactured is to anneal (at a temperature higher than the blocking temperature of the first antiferromagnetic layer 9) under a field that polarises the reference layer 3 along the right direction relative to the field line (i.e. perpendicular to the field generation lines as illustrated in FIG. 2); the polarisation layer 8 made of hard material is then polarised by applying a field at ambient temperature that saturates it along the required direction, in other words transverse to the magnetisation of the reference layer and therefore parallel to the field generation lines. This field will not modify the pinning direction of the reference layer since it is applied at ambient temperature (therefore less than the blocking temperature of the first antiferromagnetic layer 9).

Figure 7:
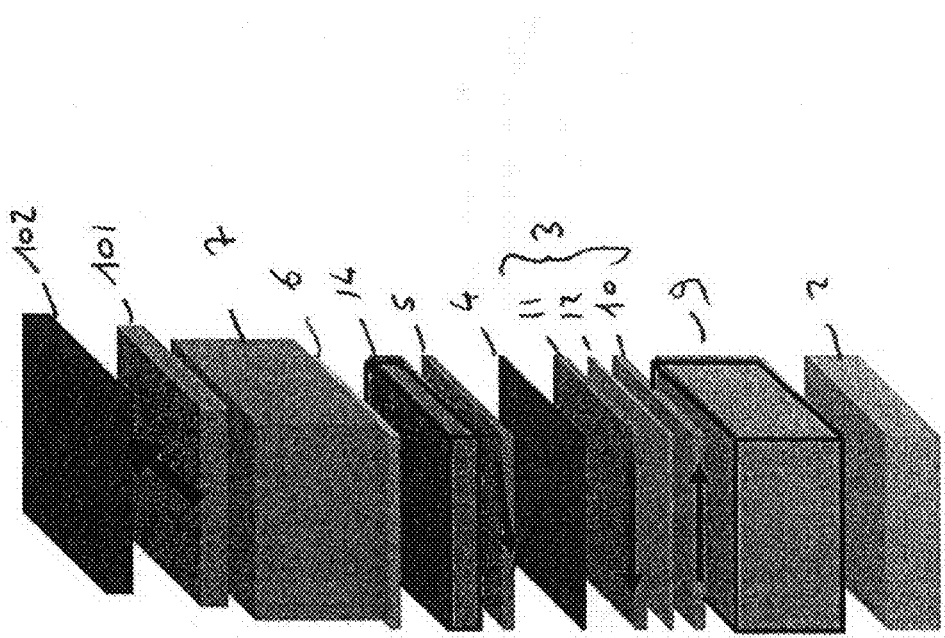
FIG. 7 illustrates a second embodiment of a magnetic device according to the invention.

FIG. 7 illustrates a second embodiment of a magnetic device 100 according to the invention; this device 100 is almost identical (common characteristics have the same references) to the device 1 in FIG. 1, with the following differences:
 a magnetic layer 101 composed for example of a cobalt-iron alloy;
 a third antiferromagnetic layer 102.

This third antiferromagnetic layer 102 pins the direction of magnetisation of the magnetic layer 101 by exchange anisotropy. The third antiferromagnetic layer 102 may for example be made of PtMn with a thickness of between 5 and 10 nm (for example 8 nm). The third antiferromagnetic layer 102 has a higher blocking temperature than the second antiferromagnetic layer 14 and lower than the first antiferromagnetic layer 9. Thus, the blocking temperature of the third antiferromagnetic layer 14 (PtMn) is preferably close to 300° C. while the blocking temperature of the first antiferromagnetic layer 9 (NiMn) is greater than or equal to 350° C. and the blocking temperature of the second antiferromagnetic layer 14 (IrMn) is close to 200° C. Having different blocking temperatures in particular helps to orient the magnetisation of the reference layer and then magnetisation of the polarisation layer. These differences between the blocking temperatures of the antiferromagnetic materials can also be seen in FIG. 4 that shows the change in the variation of the pinning field and the interface pinning energy for different antiferromagnetic materials. It should be noted that on the contrary, magnetisation of the polarisation layer could be oriented first and then magnetisation of the reference layer. In this case, the blocking temperature of the antiferromagnetic layer 102 would have to be higher than the blocking temperature of the antiferromagnetic layer 9.

In the case in which the blocking temperature of the material of the third antiferromagnetic layer 102 that pins the bias layer 101 (blocking temperature of the order of 270° C. for PtMn) is less than the blocking temperature of the material of the first antiferromagnetic layer 9 that pins the reference layer 3 (blocking temperature of the order of 350° C. for NiMn), the first step necessary to initialise the device 100 during manufacturing is to anneal the device at high temperature in a field that can orient the reference layer 3 along the right direction and then lower the temperature to become intermediate between the blocking temperatures of the third and the first antiferromagnetic layers; a field is then applied along the direction along which it is required to magnetise the bias layer 101, and finally this field is maintained while cooling to ambient temperature.

As we mentioned above, the presence of the bias field in devices 1 and 100 in FIGS. 1 and 7 causes a misalignment of the magnetisation of the storage layer from a perfect parallel or perfect antiparallel alignment. We have shown that this alignment is not critical and does not degrade operation of the device. However, the effect of this misalignment can be minimised.

The effect of misalignment shown in FIG. 5 can also be reduced by using materials with strong magnetisation at the write temperature (such that a sufficient polarisation field is created during the final heating phase) but with a weaker magnetisation at lower temperature, in the layer creating the polarisation field. Such a result can be obtained using natural or artificial ferrimagnetic materials for which the compensation point (i.e. approximately zero magnetic field created) is located within the operating temperature range of the device when not writing (typically for a temperature of between 0° C. and 80° C.). In this type of material, magnetisation is zero at the compensation point and increases above the compensation point up to a given temperature at which magnetisation decreases again. This is the case for Rare earth/transition metal alloys (for example TbCo, TbFe, DyCo or DyFe). The compensation point is adjusted as a function of the relative concentration of Rare Earth and transition metal.

Artificial ferrimagnetic materials can also be used comprising two layers antiferromagnetically coupled through a spacer (for example made of Ru), each having different thermal variations in temperature.

Figure 8:
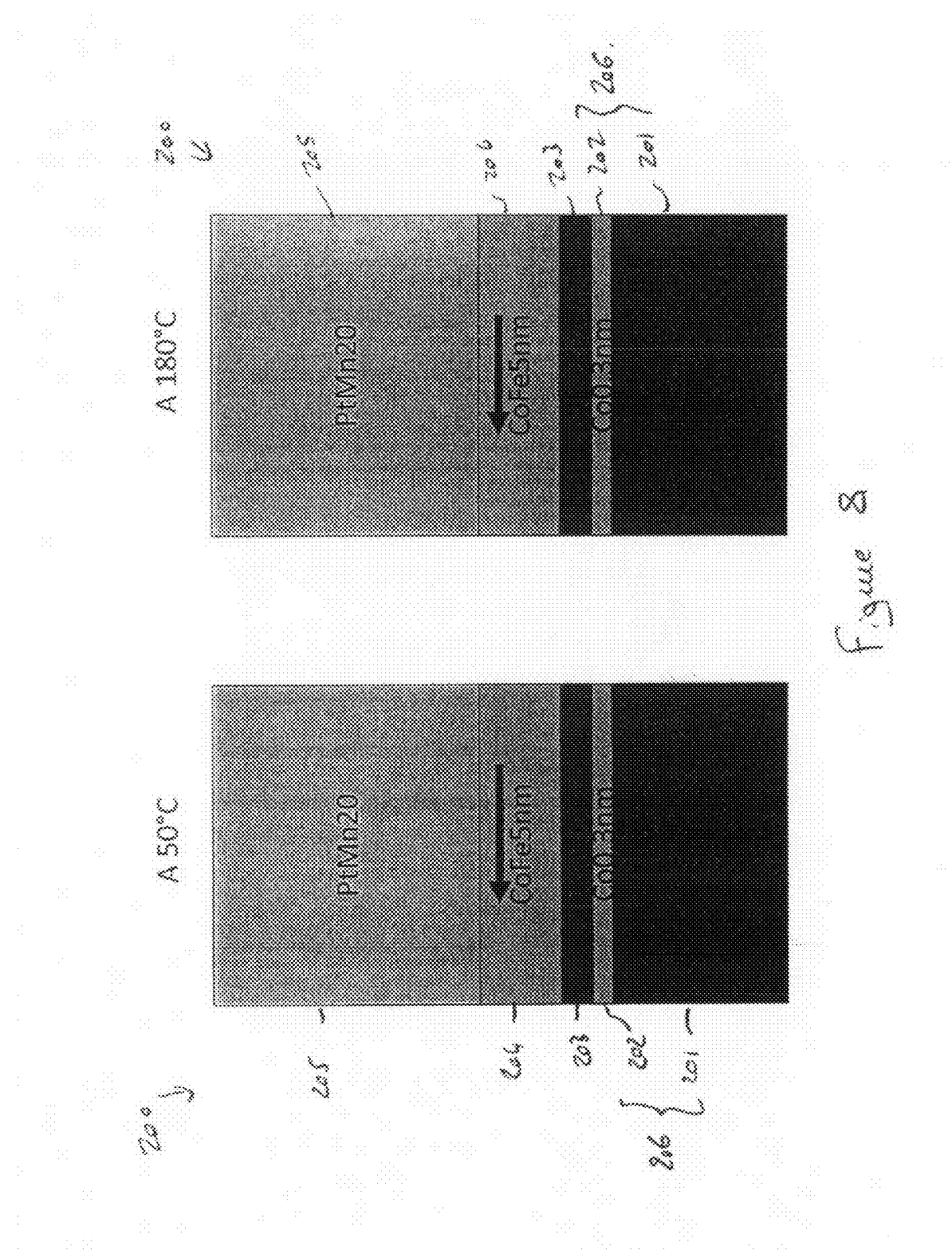
FIG. 8 illustrates a third embodiment minimising the misalignment induced by the presence of the polarisation field according to this invention.
Figure 9:
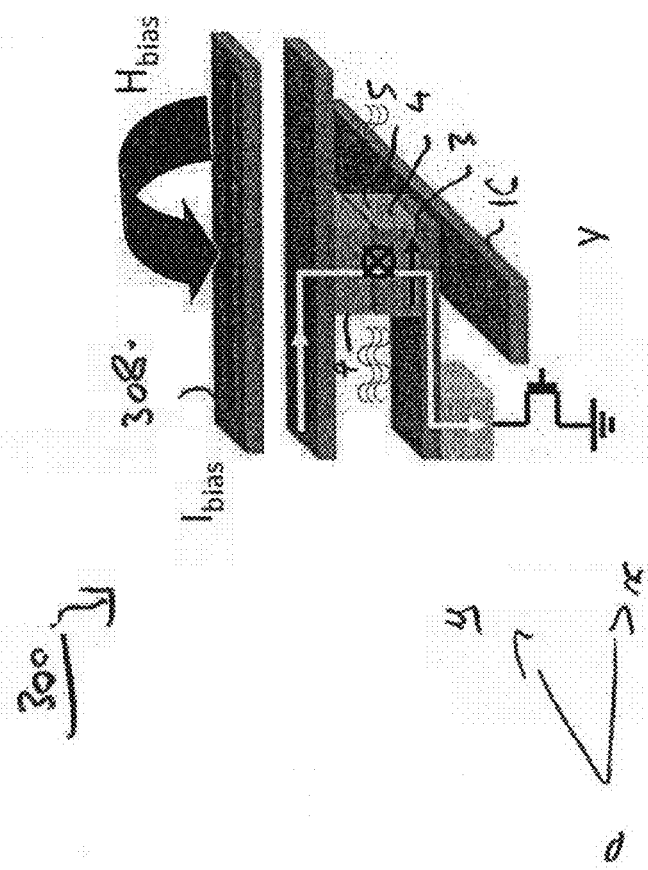
FIG. 9 illustrates a fourth embodiment of the device according to the invention.

An example of such a structure using artificial ferrimagnetic materials is shown in FIG. 8.

Thus, the layer 8 in FIG. 1 or the layers 101 and 102 in FIG. 7 can be replaced by the stack 200 in FIG. 8.

This stack 200 comprises:
a biferromagnetic layer 206 including a layer 201 of NiFe (for example 8 nm thick) and a layer 202 of Co (for example 0.3 nm thick);
a spacer 203 (in this case Ru 0.6 nm thick);
a ferromagnetic layer 204 of CoFe (for example 5 nm thick).

In such a structure, magnetisation of the ferromagnetic layer 201 of NiFe (that has a Curie temperature of 800K) decreases faster than magnetisation of the ferromagnetic layer 204 of CoFe (that has a Curie temperature of the order of 1200K). Thus, the sum of the magnetisations of the two magnetic layers 201 and 204 can be almost zero at ambient temperature (typically for a temperature of 50° C. as shown in the left part of FIG. 8) but may have a high value at the temperature of the stack 200 at the time that the storage layer is written (for example at 180° C. as shown on the right part of FIG. 8).

The ferromagnetic layer 204 can be pinned by an antiferromagnetic layer 205, for example made of PtMn.

In other words, at the operating temperature of the device according to the invention (when not writing), typically at ambient temperature, the magnetisations of the NiFe/Co dual layer and the CoFe layer approximately compensate each other.

On the contrary at 180° C., magnetisation of the NiFe layer reduces much more than magnetisation of the CoFe layer such that the polarisation field radiated on the storage layer during the terminal heating phase is positive and has a higher modulus, of the order of half of the writing field. The purpose of the 0.3 nm Co layer at the contact with the NiFe layer is to maximise antiferromagnetic coupling through the Ru. Coupling would be very much lower if the NiFe layer were in direct contact with the Ru spacer such that the antiparallel alignment through Ru would not be maintained correctly in the presence of the writing field.

According to the solution shown in FIG. 8, a polarisation field is only created at the end of heating temperature, and this field disappears almost completely when the temperature drops.

The FIG. 8 illustrates a fourth embodiment of a device 300 according to the invention capable of overcoming misalignment problems causing loss of magnetoresistance.

As in the case in FIG. 2, only the storage layer 5, the reference layer 3, the spacer 4 and the adaptation layer 7 are shown and other layers of the stack are not shown, for simplification reasons. The device 300 is identical to the device in FIGS. 1 and 2 except that there is no layer of hard material to create the polarisation field. On the other hand, the device 300 comprises a conducting line 308 to generate a magnetic polarisation field located above the stack and perpendicular to the write line 16.

As before, the reference layer 3 has magnetisation along the direction pinned in the plane of the reference layer 3. This can be illustrated by assuming that the magnetisation of the reference layer 3 pinned by its first antiferromagnetic layer is along the +Ox direction in the Oxy plane coordinate system parallel to the planes of the layers in the stack.

Note that the line 308 could perfectly well be below the stack while the write line 16 could be above it.

During heating, a current is passed in line 308, generating a transverse field Hbias (oriented along the Oy or −Oy direction, therefore perpendicular to the possible directions of magnetisation of the storage layer 5 at rest) on the storage layer 5 of the junction (and parallel to the plane of the layers).

The storage layer 5 is thus transversely polarised by the Hbias field during the terminal heating phase. This polarisation field is then cut off (i.e. current is no longer passed along line 308) during the cooling phase so that only the writing field is applied during the cooling phase through the conducting line 16.

According to another embodiment, not shown, a permanent magnet located above or below several memory points and covering all said memory points can be used to generate the polarisation field. For example, this permanent magnet could be made from a hard material.

According to another embodiment, not shown, two permanent magnets located on each side of several memory points can be used to generate the polarisation field.

The magnetic layers have an in-plane direction of magnetisation in all the embodiments described with reference to FIGS. 1 to 8, in other words the magnetisations of the magnetic layers are parallel to the plane in which each layer is located. However, the magnetic device according to the invention can also be made with out-of-plane magnetisations, in other words the magnetisations of the magnetic layers would be perpendicular to the plane in which the magnetic layers are located. In this case, the polarisation layer (that may for example be a ferromagnetic layer pinned by an antiferromagnetic layer) creates a bias field in the plane of the layers such that during heating, as perpendicular anisotropy reduces, magnetisation of the storage layer is oriented in the plane of the layers (i.e. approximately parallel to the direction of the bias field). During this time, magnetisation of the reference layer remains oriented out-of-plane such that the magnetisations of the storage and reference layers are in a configuration at 90° during the terminal heating phase regardless of the initial state P or AP.

The magnetic device according to the invention as described above as a memory point can also be used as a Magnetic Logic Unit.

Figure 10:
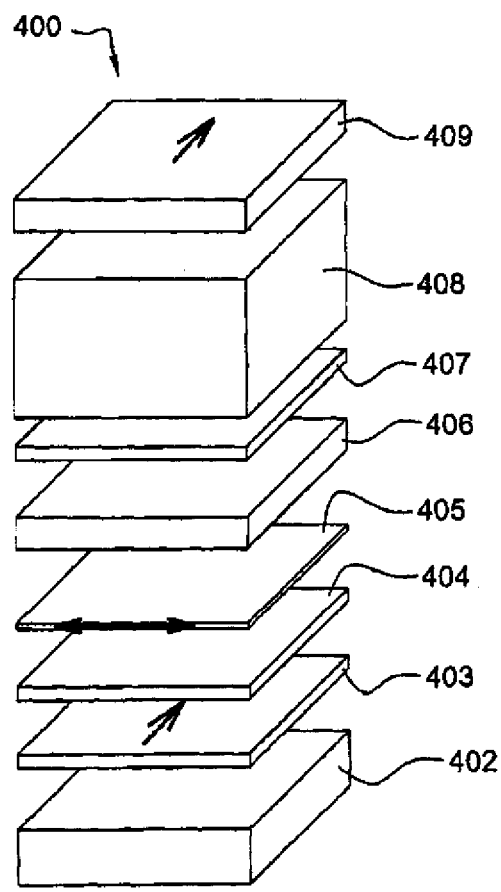
FIG. 10 illustrates a fifth embodiment of a device according to the invention when this device is a <<Magnetic Logic Unit>>.

FIG. 10 thus illustrates a Magnetic Logic Unit 400.

Unlike device 1 in FIG. 1, this device 400 comprises a reference layer 403 that is not pinned.

More precisely, the device 400 comprises the following in sequence:
- a buffer layer 402;
- a reference layer 403;
- a spacer 404;
- a storage layer 405 separated from the reference layer 403 by said spacer 404;
- an antiferromagnetic layer 406 pinning the magnetisation of the storage layer 405;
- a functional layer related to fabrication 407;
- an adjustment layer 408;
- a polarisation layer 409.

In this case the reference layer 403 has a variable direction of magnetisation.

This device can read information stored in the storage layer 405 without needing to use a reference resistance value. This magnetic device allows differential reading of information contained in the storage layer 405 making use of the reference layer 403.

This is done by measuring the resistance of the device when the magnetisation of the reference layer 403 is in one direction, and then measuring the resistance of this device when the magnetisation of the reference layer 403 is in the other direction. The values of these two resistances are then compared to deduce the direction of the magnetisation of the storage layer.

This is done using a first magnetic field pulse to orient the magnetisation of the reference layer along a predetermined direction. The resistance of the device is then measured. A second magnetic field pulse is then applied to orient the magnetisation of the reference layer in the direction opposite to the first predetermined direction. The resistance of the device is then measured again. The direction of magnetisation of the reference layer after each current pulse is known, because the direction of the applied magnetic field pulses is known. Consequently, the direction of magnetisation of the storage layer is deduced by comparing the resistance of the device after the first current pulse and after the second current pulse.

The reference layer 403 in this case is composed of a magnetic layer, for example based on a cobalt-iron-boron alloy, that has a variable magnetisation direction and is preferably between 1 and 4 nm thick.

The magnetic device then comprises the storage layer 405 separated from the reference layer 403 by the spacer 404. The spacer 4 may be a tunnel barrier selected from a group including aluminium oxides $AlO_x$, titanium oxides $TiO_x$ and magnesium oxide MgO. Alternatively, the spacer 404 may be composed of a semiconductor. Thus, the spacer may be composed of silicon, germanium or GaAs. The spacer 404 can also be made from a heterogeneous metal/oxide layer such as a confined current paths layer composed of an insulating barrier, for example made of 2 nm thick alumina through which conducting channels pass, for example copper channels with a nanometric diameter, typically between 1 and 4 nm. The spacer 404 is preferably between 0.6 nm and 5 nm thick.

The storage layer 405 is a magnetic layer that has a variable direction of magnetisation. This storage layer 405 may be a single magnetic layer or a stack of layers. For example, the storage layer 405 may be composed of a stack of layers comprising:
- a layer composed of a ferromagnetic material with a face-centred cubic crystallographic structure at the contact with the second antiferromagnetic layer;
- an amorphous or semi-amorphous transition layer at the contact with the ferromagnetic layer with a face-centred cubic structure;
- a ferromagnetic layer with a face-centred cubic crystallographic structure, for example an Fe-rich CoFe alloy or a layer of amorphous CoFeB at the time that layers are deposited but that crystallises in face-centred cubic form when the stack is annealed.

This type of storage layer is particularly attractive in the case in which the spacer 404 is a tunnel barrier based on MgO with a face-centred cubic crystallography structure.

The storage layer 405 may also be composed of a synthetic triple antiferromagnetic layer.

In the example in FIG. 10, the storage layer 405 is composed of a single layer followed by the second antiferromagnetic layer 14. This single layer may for example be composed of a cobalt-iron-boron alloy. The storage layer is preferably between 1 and 4 nm thick.

The antiferromagnetic layer 406 pins the direction of magnetisation of the storage layer 405 during reading and in standby mode, in other words when the memory point keeps information when it is not being read or written, and enables the direction of magnetisation of the storage layer 405 to be released during a write. For example, the antiferromagnetic layer 406 may be made from IrMn between 5 and 7 nm thick.

As before, the MLU magnetic device 400 according to the invention also comprises a polarisation layer 409 to apply a magnetic polarisation field such that magnetisation of the storage layer 405 is always in the same direction as said magnetic polarisation field at the time of reaching the blocking temperature of the antiferromagnetic layer 406. Unlike the previous embodiments, in the case of the device 400, the direction of magnetisation of the reference layer 403 will also be the same as the direction of the magnetic polarisation field at the time of reaching the blocking temperature of the antiferromagnetic layer 406 because magnetisation of the reference layer 403 is not pinned.

Operation of the magnetic device 400 in write is exactly the same as operation of the device in FIG. 1.

When writing, during the heating phase, the polarisation field created by the layer 409 is applied to the stack; under the effect of this transverse bias field, since pinning of the storage layer 405 by the antiferromagnetic layer 406 decreases as the stack temperature increases, magnetisation of the storage layer 405 will tend to be oriented parallel to the bias field, the same will apply to magnetisation of the unpinned reference layer 403. Thus, magnetisations of the storage layer 405 and the reference layer 403 will be parallel at the end of heating, regardless of the initial orientation P or AP relative to the initial orientation of the reference layer 403.

The above-mentioned advantage is less important for some MLU devices that have frequently magnetostatic coupling between the unpinned storage layer and reference layer; this coupling may be strong enough so that magnetisation of the reference layer always spontaneously returns to be parallel or antiparallel to the magnetisation of the storage layer. This depends on whether the storage layer is a simple or synthetic antiferromagnetic layer and the manner in which this synthetic antiferromagnetic layer is decompensated. If the device always spontaneously moves into the same state in a zero field, application of a polarisation field will not be harmful but will obviously be less efficient; however, even in this case, application of this polarisation field can facilitate coherent rotation of the magnetisations of storage and reference layers at the time of writing or reading.

Moreover, the full advantage of the presence of this polarisation field is obtained in other MLU type devices when coupling between the storage layer and the reference layer is minimised so that the reference layer is as soft as possible or has a symmetric behaviour in the applied field. In this case, the application of a transverse polarisation field enables magnetisations of the reference and storage layers to be parallel at the end of the heating step and before the writing field is applied. Heating is then identical regardless of whether the storage layer is oriented in "0" or in "1", avoiding the risks of a temperature rise dependent on the initial magnetic state of the storage layer.

This risk of a temperature rise is particularly critical in the application case in which MLU devices such as the device 400 in FIG. 10 are connected in series or in parallel and can be in different initial magnetic states.

Figure 11:
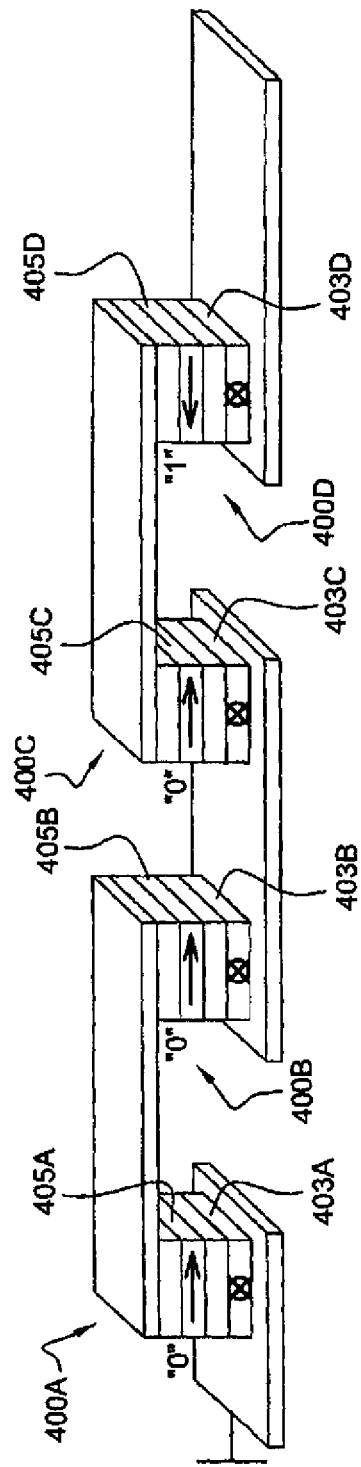
FIG. 11 shows a plurality of devices like that in FIG. 10 connected in series.

Such a configuration is thus illustrated in FIG. 11 that shows four devices 400A, 400B, 400C and 400D connected in series with a structure identical to the structure of the device 400 in FIG. 10. Each of the devices 400A to 400D in this figure is shown in a state of rest (not in a write or read step). In this state, the presence of the polarisation field means that all the reference layers 403A to 403D have spontaneously oriented magnetisation (in zero write or read field) along a direction perpendicular to the directions of magnetisation of the storage layers 405A, 405B, 405C and 405D. During the write, the first step is to heat the devices without applying the writing field such that magnetisations of all the storage layers 405A to 405D will also tend to orient themselves along the polarisation field such that devices 400A and 400B along the same line in series will heat identically.

In this embodiment, since the bias field is always present (because it was created by permanent magnet layers and not by a current circulating in a field creation line), when there is no write or read field, this bias field polarises magnetisations of the reference layers perpendicular to magnetisations of storage layers.

When reading, read fields are then applied to the reference layers 403A to 403D such that their magnetisation is rotated towards the right or the left to become closer to the P or AP alignment relative to the magnetisation of their corresponding storage layer. This rotation of the magnetisation of reference layers is very reversible due to the presence of the bias field.

Obviously, the invention is not limited to the embodiments described with reference to the figures and variants can be envisaged without going outside the scope of the invention. In particular, the materials and thicknesses chosen to make the buffer layers, the reference layers, the storage layers and the spacers are only given for guidance and other materials and thicknesses can be used.

The invention claimed is:

1. Magnetic device with thermally-assisted switching comprising:
   a first magnetic layer;
   a second magnetic layer that has a variable direction of magnetisation;
   a spacer that separates the first magnetic layer and the second magnetic layer and magnetically decouples them;
   an antiferromagnetic pinning layer in contact with the second magnetic layer, the antiferromagnetic layer being capable of pinning the direction of magnetisation of the second magnetic layer, said second magnetic layer having at least two storage levels corresponding to two stable pinned directions of magnetisation;
   a heating device configured to heat said pinning layer such that, during heating, the temperature of said pinning layer exceeds its blocking temperature such that the direction of magnetisation of said second magnetic layer is no longer pinned;
   a device configured to apply a writing magnetic torque tending to align the magnetisation of the second magnetic layer along one of the two stable magnetisation directions once said blocking temperature is reached;
   a magnetic polarisation field generating device configured to apply a magnetic polarisation field at least during the heating phase before the blocking temperature is reached such that the direction of magnetisation of said second magnetic layer is always along the direction of said magnetic polarisation field at the moment that the blocking temperature is reached.

2. The magnetic device according to claim 1, wherein said device configured to apply a writing magnetic torque is configured to apply a writing magnetic field tending to align the magnetisation of the second magnetic layer along one of the two stable magnetisation directions once said blocking temperature is reached.

3. The magnetic device according to claim 2, wherein an amplitude of the magnetic polarisation field is between 10% and 120% of the amplitude of the writing magnetic field.

4. The magnetic device according to claim 1, wherein a direction of said magnetic polarisation field is different from said two stable pinned directions of magnetisation.

5. The magnetic device according to claim 4, wherein a direction of the polarisation field is approximately perpendicular to the stable pinned directions of magnetisation.

6. The magnetic device according to claim 1, wherein the magnetic polarisation field generating device is formed from a layer of hard ferromagnetic material located close to said second magnetic layer.

7. The magnetic device according to claim 1, wherein the magnetic polarisation field generating device is formed from a layer of ferromagnetic material, the magnetisation of which is pinned by an antiferromagnetic layer, which is located close to said second magnetic layer.

8. The magnetic device according to claim 1, wherein the magnetic polarisation field generating device is formed by at least one layer of natural or artificial ferrimagnetic material for which the magnetisation increases significantly as its temperature gets closer to said blocking temperature and reduces at a lower temperature.

9. The magnetic device according to claim 1, wherein the magnetic polarisation field generating device is formed by a field generating conducting line in which a current circulates.

10. The magnetic device according to claim 1, wherein the first and second magnetic layers have a direction of magnetisation outside the plane of said layers, said magnetic polarisation field being parallel to the plane of the magnetic layers.

11. A magnetic memory comprising a plurality of memory points, each memory point being a magnetic device according to claim 1.

12. Logic unit comprising a plurality of logic elements connected in series or in parallel, each logic element being a magnetic device according to claim 1.

13. Method of writing information in the second magnetic layer of a device according to claim 1 comprising:
   applying a polarisation field without a writing magnetic torque while injecting a current in said device so as to heat it to reach the blocking temperature of said pinning layer;
   once the blocking temperature has been reached, applying a writing magnetic torque to the magnetisation of the second magnetic layer to orient the magnetisation of the second magnetic layer along one of the two stable directions of magnetisation.

14. The magnetic device according to claim 3, wherein the amplitude of the magnetic polarisation field is between 25% and 120% of the amplitude of the writing magnetic field.

* * * * *

UNITED STATES PATENT AND TRADEMARK OFFICE
CERTIFICATE OF CORRECTION

PATENT NO. : 8,958,240 B2  Page 1 of 9
APPLICATION NO. : 13/939441
DATED : February 17, 2015
INVENTOR(S) : Bernard Dieny et al.

It is certified that error appears in the above-identified patent and that said Letters Patent is hereby corrected as shown below:

Delete Title Page with illustrative Figure, and replace with new Title Page with illustrative Figure (attached)

In the Drawings

Delete Drawing Sheets 1-7, and replace with Drawing Sheets 1-7 (attached)

Signed and Sealed this
Second Day of June, 2015

Michelle K. Lee
*Director of the United States Patent and Trademark Office*

(12) United States Patent
Dieny et al.

(10) Patent No.: US 8,958,240 B2
(45) Date of Patent: Feb. 17, 2015

(54) MAGNETIC DEVICE WITH THERMALLY-ASSISTED SWITCHING

(71) Applicant: Commissariat a l'energie atomique et aux energies alternatives, Paris (FR)

(72) Inventors: Bernard Dieny, Lans en Vercors (FR); Ricardo Sousa, Grenoble (FR)

(73) Assignee: Commissariat À l'Énergie Atomique et aux Énergies Alternatives, Paris (FR)

(*) Notice: Subject to any disclaimer, the term of this patent is extended or adjusted under 35 U.S.C. 154(b) by 5 days.

(21) Appl. No.: 13/939,441

(22) Filed: Jul. 11, 2013

(65) Prior Publication Data
US 2014/0016405 A1 Jan. 16, 2014

(30) Foreign Application Priority Data
Jul. 11, 2012 (FR) .................................. 12 56670

(51) Int. Cl.
G11C 11/16 (2006.01)
(52) U.S. Cl.
CPC .......... *G11C 11/161* (2013.01); *G11C 11/1675* (2013.01)
USPC ...................................................... 365/158
(58) Field of Classification Search
CPC .................................................. G11C 11/1675
USPC ....................................... 365/158, 171, 173
See application file for complete search history.

(56) References Cited

U.S. PATENT DOCUMENTS

| 6,603,677 B2* | 8/2003 | Redon et al. ............ 365/158 |
| 7,898,833 B2* | 3/2011 | Prejbeanu et al. ........ 365/50 |
| 7,903,452 B2* | 3/2011 | Dittrich et al. ........... 365/158 |
| 8,717,812 B2* | 5/2014 | Mackay et al. ........... 365/171 |
| 2005/0180202 A1 | 8/2005 | Huai et al. |

FOREIGN PATENT DOCUMENTS

| EP | 2 447 948 | 5/2012 |
| FR | 2 817 999 | 6/2002 |
| FR | 2 924 851 | 6/2009 |

OTHER PUBLICATIONS

Preliminary Search Report and Written Opinion as issued for French Patent Appln. No. 1256670, dated May 15, 2013.

* cited by examiner

*Primary Examiner* — Harry W Byrne
*Assistant Examiner* — Lance Reidlinger
(74) *Attorney, Agent, or Firm* — Pillsbury Winthrop Shaw Pittman LLP

(57) ABSTRACT

A magnetic thermally-assisted switching device includes a reference layer, a storage layer magnetised along a variable direction, a spacer that separates the reference layer and the storage layer, and magnetically decouples them, a device for heating the pinning layer so that, during heating, the temperature of the pinning layer exceeds its blocking temperature such that the direction of magnetisation of the storage layer is no longer pinned, a device for applying a writing magnetic torque tending to align the magnetisation of the storage layer along one of two stable magnetisation directions once the blocking temperature is reached. The device also includes a device for applying a magnetic polarisation field at least during the heating phase before the blocking temperature is reached such that the direction of magnetisation of the storage layer is always along the direction of the magnetic polarisation field at the moment that the blocking temperature is reached.

14 Claims, 10 Drawing Sheets

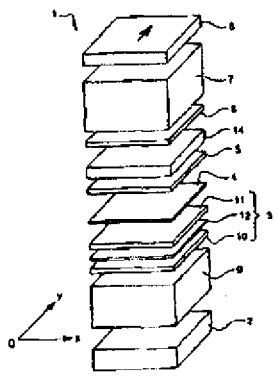

Fig. 5     Fig. 6